United States Patent
Zhang et al.

(10) Patent No.: US 9,728,472 B2
(45) Date of Patent: Aug. 8, 2017

(54) METHOD FOR WAFER ETCHING IN DEEP SILICON TRENCH ETCHING PROCESS

(71) Applicant: CSMC TECHNOLOGIES FAB1 CO., LTD., Jiangsu (CN)

(72) Inventors: Anna Zhang, Jiangsu (CN); Xiaoming Li, Jiangsu (CN)

(73) Assignee: CSMC Technologies FAB1 Co., Ltd. (CN)

( * ) Notice: Subject to any disclaimer, the term of this patent is extended or adjusted under 35 U.S.C. 154(b) by 0 days.

(21) Appl. No.: 14/435,955

(22) PCT Filed: Dec. 31, 2013

(86) PCT No.: PCT/CN2013/091182
§ 371 (c)(1),
(2) Date: Apr. 15, 2015

(87) PCT Pub. No.: WO2014/108037
PCT Pub. Date: Jul. 17, 2014

(65) Prior Publication Data
US 2015/0332981 A1    Nov. 19, 2015

(30) Foreign Application Priority Data
Jan. 11, 2013   (CN) .......................... 2013 1 0011772

(51) Int. Cl.
*H01L 21/3065*   (2006.01)
*H01L 21/66*    (2006.01)
*H01L 21/683*   (2006.01)

(52) U.S. Cl.
CPC .......... *H01L 22/26* (2013.01); *H01L 21/3065* (2013.01); *H01L 21/6831* (2013.01)

(58) Field of Classification Search
CPC . H01L 22/26; H01L 21/3065; H01L 21/6831; H01L 21/683; H01L 21/66
(Continued)

(56) References Cited

U.S. PATENT DOCUMENTS 5,880,924 A  *  3/1999  Kumar ................ H01L 21/6831
                                                279/128
2003/0207579 A1*  11/2003  Rattner ............ H01L 21/76232
                                                438/700
(Continued)

FOREIGN PATENT DOCUMENTS

CN        1680876 A     10/2005
CN       101206997 A     6/2008
(Continued)

OTHER PUBLICATIONS

International Search Report mailed Mar. 27, 2014, cited by State Intellectual Propoerty Office of the P.R. China Patent Office, and which was cited in the international patent application PCT/CN2013/091182, filed Dec. 31, 2013, to which this application claims priority (3 pages).

*Primary Examiner* — Selim Ahmed
(74) *Attorney, Agent, or Firm* — Mark Malek; Paul J. Ditmyer; Widerman Malek, PL

(57) ABSTRACT

A method for wafer etching in a deep silicon trench etching process includes the following steps: a. electrostatically absorbing a wafer using an electrostatic chuck, and stabilizing the atmosphere required by the process (S110); b. performing the sub-steps of a main process for the wafer, and the time for the sub-steps of the main process being shorter than the time required by the wafer main process; c. releasing the electrostatic adsorption of the electrostatic chuck on the wafer; d. determining whether the cumulative time of the sub-steps of the main process reaches a predetermined threshold or not, if so, performing the step e (S150), and if not, repeating the operations in the steps a to c (S140); and e. ending a wafer manufacturing process. The etching method avoids the wafer from continuous contact with the electrostatic chuck, reduces electrostatic accumu- (Continued)

lation on the surface of the wafer, and therefore solves the problem of resist reticulation on the surface of the wafer in the DSIE process.

11 Claims, 2 Drawing Sheets

(58) Field of Classification Search
USPC .............................................................. 438/5
See application file for complete search history.

(56) References Cited

U.S. PATENT DOCUMENTS

2005/0083634 A1* 4/2005 Breitschwerdt ... H01L 21/67109
  361/234
2012/0200981 A1* 8/2012 Zhang ................ H01L 21/6833
  361/212

FOREIGN PATENT DOCUMENTS

| CN | 101752225 A | 6/2010 |
| CN | 103107080 A | 5/2013 |
| JP | H02-215126 A | 8/1990 |

* cited by examiner

METHOD FOR WAFER ETCHING IN DEEP SILICON TRENCH ETCHING PROCESS

CROSS REFERENCE TO RELATED APPLICATIONS

This is a national stage application under 35 U.S.C. 371 of PCT patent application PCT/CN2013/091182, filed on Dec. 31, 2013, which claims the benefit of CN 2013-10011772.0, filed on Jan. 11, 2013, each of which is hereby incorporated by reference in its entirety.

FIELD OF THE INVENTION

The present invention relates to a field of semiconductor fabrication, and more particularly relates to a method of etching a wafer in a deep silicon trench etching process.

BACKGROUND OF THE INVENTION

In semiconductor manufacturing process, trenches are often etched on the wafer. In some special application field, semiconductor devices of the integrated circuit need to etch deep silicon trenches. Deep silicon trench etching (DSIE) process is used to etch deep silicon trenches. In the DSIE process, the wafer is used as a substrate, a photoresist is used as a mask layer, patterns can be transferred on the wafer, and some special functions can be achieved.

In a conventional DSIE process, as the DSIE process time is long, an etching depth is large (the etching depth can be several hundred micrometers), and the DSIE process is limited by the thickness of the photoresist, after deep silicon trenches are etched, resist reticulation will be formed on the wafer, part of the photoresist will be completely etched away on the wafer. The above phenomena will lead to problems such as patterns of the wafer are not complete, sizes are irregular and have large errors, the photoresist on a surface of the wafer after the DSIE process is difficult to remove. Meanwhile, the photoresist is not protected enough, a DSIE etching depth is limited, which cannot meet requirements of more manufacturing process. The problem of resist reticulation on the wafer after DSIE process has become a development bottleneck of the manufacturing process.

In order to overcome problems such as resist reticulation on the wafer in the DSIE process, patterns are not complete after the DSIE process, photoresists on the wafer surface are difficult to remove. $SiO_2$ or SiN is proposed as an etching mask layer to replace the photoresist in the art to avoid problems caused by using the photoresist as the mask layer. However, using $SiO_2$ or SiN as the etching mask layer cannot solve the problem of resist reticulation on the wafer surface caused by using the photoresist as the mask layer essentially, and also new problems are aroused. When $SiO_2$ or SiN is used as the mask layer, $SiO_2$ and SiN cannot be removed completely after the DSIE process, there will be fragments on the wafer surface, which further limits a wide use of the DSIE process.

SUMMARY OF THE INVENTION

Accordingly, it is necessary to provide a method for wafer etching in deep silicon trench etching process which can prevent resist reticulation on a wafer surface in the DSIE process.

A method for wafer etching in a deep silicon trench etching process includes:

a, absorbing a wafer electrostatically using an electrostatic chuck;

b, performing sub steps of a main process to the wafer, a time of the sub steps of the main process is shorter than a required time of the wafer main process;

c, releasing an electrostatic adsorption of the electrostatic chuck to the wafer;

d, determining whether a cumulative time of the sub steps of the main process reaches a threshold value, if so, executing step e; if not, repeating step a to step c;

e, ending a wafer manufacturing process.

According to one embodiment, before step e, the method further includes:

f, connecting the wafer to the ground to release static charges.

According to one embodiment, the threshold value in step d is a required time of the wafer main process.

According to one embodiment, step a to step c are repeated at least twice.

According to one embodiment, a time of the sub step of the main process is less than 30 minutes.

According to one embodiment, a time of the static charge releasing process ranges from 1 to 2 minutes.

According to one embodiment, a helium flow is used to cool the wafer in the sub step of the main process.

According to one embodiment, the helium flow is used to cool a back side of the wafer.

According to one embodiment, a pressure of the helium flow is 1.5 mbar.

According to one embodiment, the main process is etching.

According to one embodiment, the etching is using a plasma etching gas to etch the wafer with formed mask.

According to one embodiment, after step e, the method further includes a step of transferring.

The method of etching the wafer in the deep silicon trench etching process uses sub etching steps, and the wafer dechuck process is added, which avoids the problem that the wafer continuously contacts the electrostatic chuck and subjects to the plasma bombardment for a long time, and the temperature on the surface of the wafer will increase, resist reticulation will be formed on the wafer surface.

DETAILED DESCRIPTION OF THE EMBODIMENTS

In order to clarify the objects, characteristics and advantages of the disclosure, embodiments of the disclosure will be interpreted in detail in combination with accompanied drawings. Although the present disclosure is disclosed hereinafter with reference to preferred embodiments in detail, it also can be implemented in other different embodiments and those skilled in the art may modify and vary the embodiments without departing from the spirit and scope of the present disclosure. Therefore, the present disclosure should not be limited by the embodiments disclosed herein.

Embodiment 1

Figure 1:
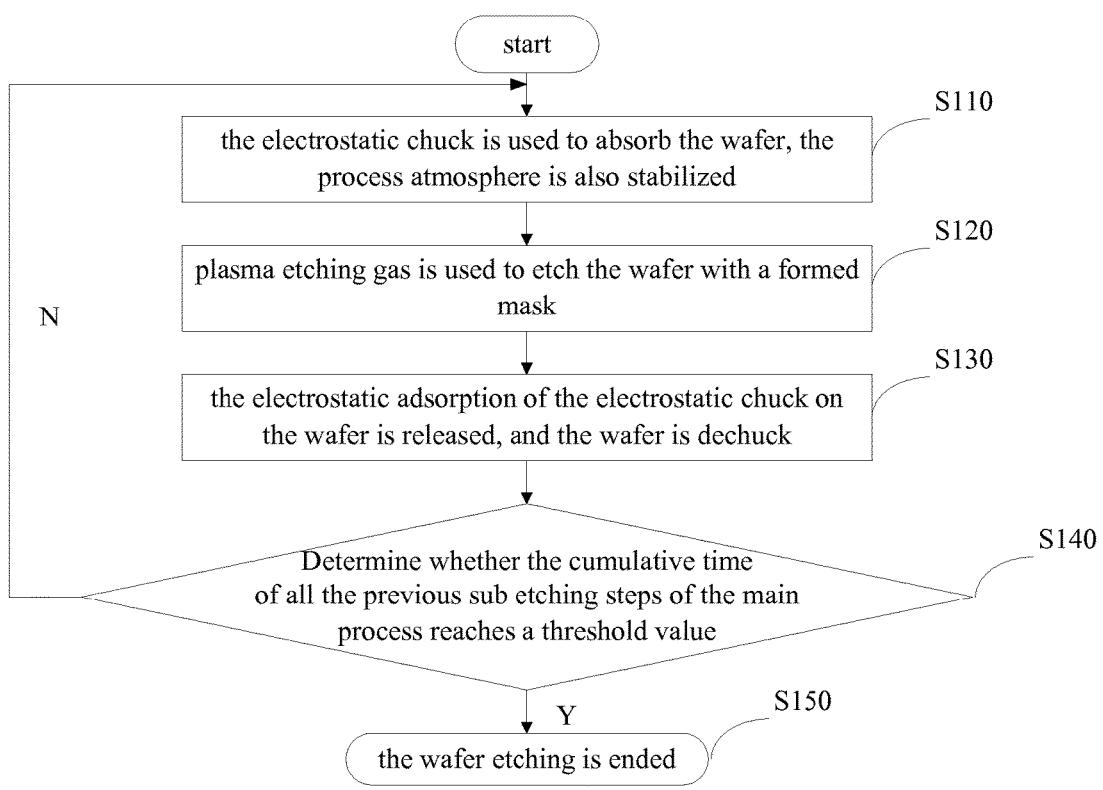
FIG. 1 is a flowchart of a method for wafer etching in a deep silicon trench etching process according to embodiment 1.

FIG. 1 is a flowchart of a method for wafer etching in the deep silicon trench etching process according to embodiment 1. In embodiment 1, a conventional single etching step of a wafer main process is divided into a plurality of sub etching steps of the main process. The etching step of the wafer main process is a step of etching the wafer. The required time of the wafer main process is the time required to complete wafer etching. The sub step of the wafer main process is to divide the step of etching the wafer into a plurality of sub steps, i.e. the wafer is etched for several times, each one etching process is referred as a sub step of the wafer main process. The time of the sub step is shorter than that of a single etching step of the main process. In the illustrated embodiment, the time of the sub step is shorter than the time of the single etching step of the main process. After each sub etching step of the main process is ended, a dechuck step is performed to the wafer, then the wafer is absorbed by the electrostatic chuck, the process atmosphere is re-stabilized for the next sub etching step of the main process. After the next sub etching step is ended, a dechuck process is performed to the wafer again, the above steps are repeated for several times until an cumulative time of all the previous sub etching step of the main process reaches a threshold value.

Specifically, embodiment 1 includes the following steps: first, preparation works are performed before the wafer etching process, i.e. step S110, in this step, the electrostatic chuck is used to absorb the wafer, the process atmosphere is also stabilized. Then step S120 is executed, which is the sub etching step of the wafer main process. In step S120, plasma etching gas is used to etch the wafer with a formed mask. The time of the step S120 is shorter than the time of the single etching step of the main process. Preferably, the time of the step S120 is much shorter than the time of the single etching step of the main process, i.e. in the method for wafer etching in the deep silicon trench etching process, the sub etching step of the wafer main process is repeated at least one time. After the sub step of the main process S120 is ended, step S130 is executed, in step S130, the electrostatic adsorption of the electrostatic chuck to the wafer is released, and a dechuck process is performed to the wafer. Then step S140 is executed, whether the cumulative time of all the previous sub etching step of the main process reaches a threshold value is determined. Specifically, whether the cumulative time of all the previous sub etching steps of the main process has reached a required length of the etching step of the main process is determined. If so, step S150 is executed, the wafer etching is ended. If not, the cumulative time of the sub etching step of the main process does not meet the requirement of the main process etching, then step S110 is executed. A rechuck process is performed to the wafer, the process atmosphere is stabilized. Then the sub etching step of the wafer main process is executed, in step S120, the plasma etching gas is used to etch the wafer with the formed mask. Then step S140 is executed, whether the cumulative time of all the previous sub etching steps of the main process reaches the required cumulative time of the etching step of the main process again is determined, the above steps are repeated until the cumulative time of all the sub etching steps of the main process reaches the required time of the main process etching, then step S150 is executed, the wafer etching is ended, then the wafer is put into a next operation, for example, the wafer is transferred out the main process chamber.

As can be seen from embodiment 1, the whole process can be divided into sub steps, the single etching process is divided into a plurality of repeated sub etching steps, after each sub etching step is ended, the dechuck process is performed to the wafer, which avoids the problem that the wafer continuously contacts the electrostatic chuck, the wafer subjects to the plasma bombardment for a long time, and the temperature on the surface of the wafer will increase, the photoresist loss rate will increase, resist reticulation will be formed on the wafer surface, and even the photoresist is etched completely.

In addition, the above method can reduce the accumulated static charges on the surface of the wafer because of the long time etching process, which avoids position fragments deviated from the electrostatic chuck because of incomplete electrostatic discharging after the etching process.

Embodiment 2

Figure 2:
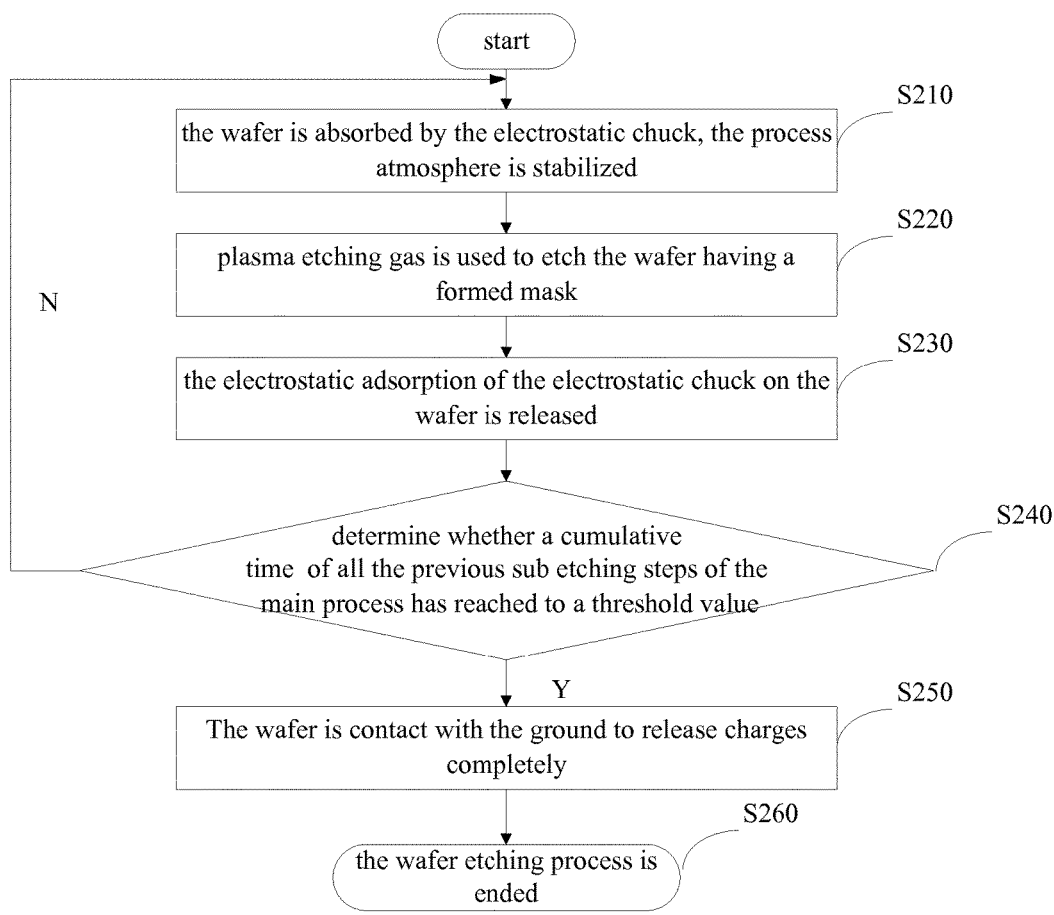
FIG. 2 is a flowchart of a method for wafer etching in a deep silicon trench etching process according to embodiment 2.

FIG. 2 is a flow chart of a method for wafer etching in deep silicon trench etching process according to claim 2. Embodiment 2 is substantially the same as embodiment 1, a conventional single etching step of the wafer main process is divided into a plurality of sub etching steps of the main process, a time of the sub step is much shorter than the original single etching step of the main process, after each sub etching step of the main process is ended, a dechuck process is performed to the wafer, the wafer is absorbed by the electrostatic chuck again, the process atmosphere is re-stabilized for the next sub etching step of the main process, after the sub etching step of the next main process is ended, the dechuck process is performed to the wafer again, the above steps are repeated until an cumulative time of all the previous sub etching step of the main process reaches a threshold value. The difference between embodiment 2 and embodiment 1 is: when the cumulative time of all the previous sub etching step of the main process reaches to the threshold value, the wafer is contacted with the ground electrode to release the static charges completely, the wafer is then put into the next operation, for example, the wafer is transferred to a main process chamber.

Specifically, embodiment 2 includes the following steps: first, preparation works are done before the wafer etching process, i.e. step S210 is executed, in this step, the wafer is absorbed by the electrostatic chuck, the process atmosphere is stabilized. Then step S220 is executed, i.e. the sub etching step of the wafer main process, in step S220, plasma etching gas is used to etch the wafer having a formed mask. Unlike the prior art, an time of the step S220 is shorter than the original single etching step of the main process, preferably, the time of the step S220 is much shorter than the original single etching step of the main process. After the sub step of the main process S220 is ended, step S230 is executed, in this step, the electrostatic adsorption of the electrostatic chuck to the wafer is released. Then step S240 is executed, determine whether an cumulative time all the previous sub etching steps of the main process has reached to a threshold value, specifically, determine whether an cumulative time all the previous sub etching steps of the main process has reached a required time of the etching step of the main process, if so, step S250 is executed, the wafer is contact with the ground to release static charges completely. If not, it means that the cumulative time of the sub etching steps of the main process does not meet a requirement of the etching step of the main process, step S210 is executed, the wafer is rechuck, the process atmosphere is stabilized, then the sub etching step of the wafer main process is executed, the above steps are repeated until the cumulative time of all the previous sub etching steps of the main process has reached a required length of the etching step of the main process, then step S250 is executed, the wafer is connected to the ground electrode, static charges are all released. Finally step S260 is executed, the wafer etching process is ended. Then the wafer is transferred.

In the illustrated embodiment, the whole etching process can be divided into sub etching steps, the single etching process is divided into a plurality of repeated sub etching steps, after each sub etching step is ended, the dechuck process is performed to the wafer, which avoids the following effects: the wafer continuously contacts the electrostatic chuck, the wafer receives plasma bombardment for a long time, the temperature on the surface of the wafer will increase, the photoresist loss rate will increase, resist reticulation will form on the wafer, even the photoresist can be etched away completely.

Meanwhile, the above method can reduce aggregated static charges on the wafer in the etching process, after the etching process is completed, besides the conventional dechuck process, the wafer is contact with the ground electrode, compared to embodiment 1, static charges are released more completely, there will be less position fragments after the etching process.

Embodiment 3

Embodiment 3 is substantially the same as embodiment 1. The difference between embodiment 1 and embodiment 3 are: in embodiment 3, a time of each sub etching step of the main process is less than 30 minutes.

In embodiment 1, the etching step of the main process is divided into a plurality of sub etching steps of the main process, which can resolve the problem of resist reticulation and the problem of chuck position fragments caused by accumulated static charges. As the silicon trench is deep, a time of the sub etching step is long, there will be problems such as slightly resist reticulation and chuck position fragments. In the illustrated embodiment, in order to resolve the above problems, the time of each sub etching step of the main process is less than or equal to 30 minutes.

Embodiment 4

Embodiment 4 is substantially the same as embodiment 2. The difference between embodiment 2 and embodiment 4 is: in embodiment 4, the time of each sub etching step of the main process is less than or equal to 30 minutes, and a better effect can be achieved.

In the illustrated embodiment, the time of each sub etching step of the main process is less than 30 minutes, resist reticulation can be prevented on the surface of the wafer. Meanwhile, a static charge releasing step can avoid the following effects: the wafer continuously contacts the electrostatic chuck, the wafer receives plasma bombardment for a long time, the wafer temperature will increase, resist reticulation will form on the wafer. The accumulated static charges on the surface of the wafer in the etching process are released, which avoids the electrostatic chuck to generate fragments.

The static charge releasing time is related to the temperature decreasing on the wafer surface and the static charge releasing extent. Too short time of static charge releasing is not conductive to reducing the temperature on the wafer surface. Too long time of static charge releasing will waste a lot of time after the temperature on the wafer is decreased and the dechuck process is performed to the wafer, thus the whole process time will be long, the producing efficiency will be low. So a time of static charge releasing process can be 1 to 2 minutes.

Embodiment 5

Embodiment 5 has made improvements to the above embodiments. Although repeated sub etching steps are used in the above embodiments to decrease the wafer temperature, in the main etching process, the wafer temperature can still be high. If the temperature decreasing is achieved only by increasing sub etching steps and static charge releasing, the whole process time will be long, the producing efficiency is low.

In the illustrated embodiment, helium flow is used to cool the wafer in the main process, the whole wafer is kept in good cooling, i.e. helium flow is used in each sub etching step of the main process to cool the wafer.

He flow is used to cool the back side of the wafer, which will not affect the whole etching step of main process.

The helium flow having too low pressure cannot cool the wafer, the helium flow with too high pressure would impact the wafer, which would affect the stability of the wafer in the etching process. The pressure of the helium flow can be 1.5 mbar.

Moreover, it is to be understood that the various embodiments of the invention, although different, are not necessarily mutually exclusive. For example, a particular feature, structure, or characteristic described in one embodiment may be included within other embodiments. The above detailed description is, therefore, not to be taken in a limiting sense, and the scope of the present invention is defined only by the appended claims, along with the full scope of equivalents to which such claims are entitled. Although in the illustrated embodiments, etching is used to illustrate the main process, it is only an example and cannot be used to limit the step of the main process, the step of the main process can be similar process steps, or it can be a combination of different process steps, the process which can lead to poor effect of chip manufacturing for any long time operation in deep silicon trench etching process can be the step of the main process.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A method of etching a wafer in a deep silicon trench etching process, comprising:
    a) absorbing a wafer electrostatically by using an electrostatic chuck;
    b) performing etching sub steps of a wafer main process, a time of performing the etching sub steps of the main process being shorter than a required time of the wafer main process;
    c) after step b, releasing the electrostatic adsorption of the electrostatic chuck to the wafer;
    d) after step c, determining whether a cumulative time of the etching sub steps of the main process reaches a threshold value, upon a determination that the threshold value has been reached the method continues to step e; and upon a determination that the cumulative time is less than the threshold value the method continues by repeating step a to step c; and
    e) connecting the wafer to a ground to release static charges and ending a wafer manufacturing process.

2. The method according to claim 1, wherein the threshold value in step d is a required time of the wafer main process.

3. The method according to claim 1, wherein operations of step a to step c are repeated at least twice.

4. The method according to claim 1, wherein a time of the etching sub step of the main process is less than 30 minutes.

5. The method according to claim 1, wherein a time of releasing static charge ranges from 1 to 2 minutes.

6. The method according to claim 1, wherein a helium flow is used to cool the wafer in the sub step of the main process.

7. The method according to claim 6, wherein the helium flow is used to cool a back side of the wafer.

8. The method according to claim 6, wherein a pressure of the helium flow is 1.5 mbar.

9. The method according to claim 1, wherein the main process is etching.

10. The method according to claim 9, wherein the etching is using a plasma etching gas to etch the wafer with formed mask.

11. The method according to claim 1, wherein after step e, the method further comprises a step of transferring the wafer.

\* \* \* \* \*